United States Patent [19]

Ishikawa

[11] Patent Number: 4,536,195
[45] Date of Patent: Aug. 20, 1985

[54] METHOD OF MAKING GRINDING STONES

[75] Inventor: Tadayuki Ishikawa, Hirakata, Japan

[73] Assignees: Kabushiki Kaisha Komatsu Seisakusho, Tokyo; Noritake Co., Ltd., Nagoya; Noritake Diamond Industries Co., Ltd., Ukiha, all of Japan

[21] Appl. No.: 656,372

[22] Filed: Oct. 1, 1984

[30] Foreign Application Priority Data

Sep. 30, 1983 [JP] Japan .................. 58-180629
Apr. 12, 1984 [JP] Japan .................. 59-71722

[51] Int. Cl.³ .............................................. B24D 17/00
[52] U.S. Cl. ........................................ 51/293; 51/295; 51/298; 51/309
[58] Field of Search ............... 51/293, 295, 298, 309; 428/689, 698

[56] References Cited

U.S. PATENT DOCUMENTS

| | | | |
|---|---|---|---|
| 2,705,194 | 3/1955 | St. Clair | 51/293 |
| 2,749,224 | 6/1956 | Block | 51/293 |
| 2,796,337 | 6/1957 | Block | 51/293 |
| 2,826,016 | 3/1958 | Hurst | 51/293 |
| 3,148,963 | 9/1964 | De Nuke | 51/293 |
| 3,377,150 | 4/1968 | Corley et al. | 51/293 |
| 3,382,057 | 5/1968 | Hohenberger | 51/293 |
| 3,517,464 | 6/1970 | Mattia et al. | 51/295 |
| 3,631,638 | 1/1972 | Yoshikawa et al. | 51/295 |
| 4,490,158 | 12/1984 | Kuromatsu | 51/295 |

Primary Examiner—Paul Lieberman
Assistant Examiner—Willie Thompson
Attorney, Agent, or Firm—Armstrong, Nikaido, Marmelstein & Kubovcik

[57] ABSTRACT

Grinding stones, especially resinous and metallic grinding stones which have a controlled distribution of abrasive grains are made by a novel method, in which electrically conductive layers of such pattern which controls sites to be bonded with the grains are formed on the selected surface of a binder sheet, the sheet is immersed in an electrolytic bath containing metallic ions and the grains, the grains are fixedly mounted on the aforementioned sites by metals deposited on the surface of binder sheet with electric paths between the conductive layers and an opposite electrode in the bath, and a plurality of said sheets are placed in layers and warm or hot pressure-molded. When the binder sheet is made from electrically conductive materials, the pattern of the conductive layers is made by masking.

41 Claims, 15 Drawing Figures

METHOD OF MAKING GRINDING STONES

BACKGROUND OF THE INVENTION

1. Field of the Invention

This invention relates to a method of making grinding stones, particularly artificial grinding stones including those in which abrasive grains are bonded to resins or metals. Throughout this specification, the term, grinding stones, means grinding, cutting, drilling, and polishing wheels, sheets, or other different shapes bonded with abrasive grains.

2. Description of the Prior Art

In the grinding operation which has been adopted from very long ago as a machining method, there remains a number of unknown factors, compared to other machining methods. To wit, the operation from selecting a grinding stone through to processing depends exclusively on the sixth sense, experience, and trial and error. Consequently, there hasn't been remarkable improvement with respect to its processing efficiency, accuracy and so on as in other machining methods. This kind of technical stagnation is due to, among other things, the fact that indefinite factors or elements associated with the employment of abrasive grinding stones in the operation as machining tools remain unsolved. Such indefinite factors are inherent in grinding stones when compared to other tools chiefly on account of the following;

(a) Grinding stones are infinitely multiple-edged tools, (b) They are provided with randomly dispersed abrasive grains which constitute cutting edges, (c) The shape of cutting edges or grain fractures is uneven, and (d) They are provided with effective cutting edges which contribute to grinding, and also with ineffective edges which do not contribute to grinding (a ratio of the effective cutting edges to the ineffective edges being generally less than 10%). In addition to inherent indefiniteness caused by the above factors (a) to (d), the grinding stones undergo changes themselves with the progress of grinding operations. However, these factors have not been addressed, as mentioned above, because they do not adversely affect grinding operations very much as the operations have been generally conducted under a comparatively mild condition and mainly for finishing work in which only a small amount of metal is to be ground off, and because abrasive grinding stones are extremely inexpensive, compared to other tools. In other words, the reasons given above made those skilled in this art neglect the aforementioned indefinite factors, and have held back research and development for eliminating them.

Nevertheless, CBN grinding stones lately introduced in the middle of 1970's and the increase of employment of such super abrasive grain grinding stones along with diamond grinding stones have thrown a new light upon grinding operations. That is, since super abrasive grains have high grinding capacities, the grinding processing method by itself is also required to be highly accurate and efficient. And, since such super abrasive grains and grinding stones made of them are extremely expensive, the old way of thinking about conventional grinding stones, that is, "they wear by nature", had to be reviewed. With this trend, requirements for grinding stones, especially for super abrasive grain grinding stones shall inevitably be changed such as follows.

(a') Random factors or elements in grinding stones have to be eliminated as much as possible, so that capacities of grinding stones can be determined and changed quantitatively, (b') Load working on each grain shall be made even, so that grinding stones can enjoy a longer life, and (c') Ineffective cutting edges have to be eliminated as much as possible so that grinding stones can have higher efficiencies though they are inexpensive.

In order to improve efficiencies of super grain grinding stones, there have been proposed lately various kinds of techniques including those in which abrasive grains coated on their surfaces with metals are bonded to a resinous matrix. The grinding stones of this kind are not comparable to with this invention, since they are not made for eliminating the aforementioned indefinite elements or factors but mainly for improving the bonding strength of grains with the resinous matrix. It shall be noted in this connection that even when the bonding characteristics of grains with a base surface such as a resinous matrix is improved, it is hard to determine efficiencies of grinding stones at constant, to change them quantitatively, and to make super grain grinding stones less expensive by decreasing the existence of ineffective cutting edges, unless the aforementioned indefinite and random elements and factors are eliminated. A method has been known, in which abrasive grains are fixed on a base support by means of electroplating. For example, it is proposed in Japanese Patent Publication No. Sho-56-42429 to adjust the dispersion of the abrasive grains in the above kind of electroplating method by adding thereto inorganic substances such as $SiO_2$, $Al_2O_3$, SiC and so on which are dielectric, inert to a plating solution, of sizes substantially equal to the grains, and less hard than them. This proposed method can, however, hardly control the distribution of abrasive grains as desired, since it does not aim by its objects to eliminate the aforementioned random or indefinite factors and elements of conventional grinding stones.

SUMMARY OF THE INVENTION

The primary object of this invention is, therefore, to provide a method of making a grinding stone, in which a random distribution of cutting edges of abrasive grains is eliminated by a technique which enables the determination of the distribution of grains in parts and as a whole quantitatively, whereby a grinding stone with a predetermined distribution of abrasives is obtainable.

Another object of this invention is to provide said method in which on account of the quantitative determination of distribution of the abrasive grains in constituent parts of a grinding stone and also by a selected combination of such parts, the effective distribution of grains is determinable generally over the stone, whereby overall efficiencies of the stone can be quantitatively determined and changed, as desired, and its life can be prolonged by making a load exerting on each grain even.

And, further another object of this invention is to provide said method, in which ineffective cutting edges can be remarkably eliminated so as to give a grinding stone of a moderate price and high quality.

In concrete, the above objects of this invention are achieved by a method which comprises;

forming on a surface of a binder sheet such as one made from a resinous film of a desired configuration a pattern of electrically conductive layers on which abrasive grains are to be fixed controllably, immersing the sheet into an electroplating bath containing metallic ions mixed with the abrasive grains, so as to fix the grains on the surface in accordance with said pattern and by means of the metals precipitated on said pattern by electric paths flowing in the bath between the conductive layers of the sheet and an opposite electrode, placing in layers a desired number of said sheets fixedly mounted with the abrasive grains, and molding the sheets into an integrate grinding stone by warm or hot pressure molding.

The above-mentioned objects are achieved also by an embodiment of the method which comprises;

forming on a surface of a metallic sheet of a desired configuration electrically nonconductive layers by means of a masking of a predetermined pattern so that surface parts of the sheet not covered by the masking and exposed outside constitute a specific conductive pattern to be bonded with abrasive grains, immersing the sheet into an electroplating bath containing metallic ions mixed with the abrasive grains so as to fix the grains on the exposed surfaces in accordance with the specific conductive pattern and by means of the metals precipitated on said specific conductive pattern by electric paths flowing in the bath between the sheet and an opposite electrode, placing in layers a desired number of said sheets fixedly mounted with abrasive grains, after removing the electrically nonconductive layers from the sheets, and molding the sheets into an integrate grinding stone by warm or hot pressure-molding.

DETAILED DESCRIPTION OF THE INVENTION

This invention is to provide a method of making grinding stones having characteristic features and efficiencies such as represented by (a') to (c') in the above "Background of the Invention", in which abrasive grains are fixedly mounted on the selected surfaces of binder sheets in accordance with predetermined patterns, and the binder sheets thus mounted with the grains are placed in layers and molded to an integrate, whereby a combination of the selection of the patterns and the selected mode of piling the binder sheets in layers can give the grinding stones the above-mentioned characteristics (a') to (c'), especially even distribution of the grains in accordance with a predetermined order.

The method of this invention comprises in general a step of forming on the selected surfaces of binder sheets electrically conductive layers of a desired pattern, a step of electroplating abrasive grains onto the surfaces in accordance with the pattern, and a step of warm or hot pressure-molding of a plurality of binder sheets in layers. These steps are explained in detail hereinunder.

Figure 1:
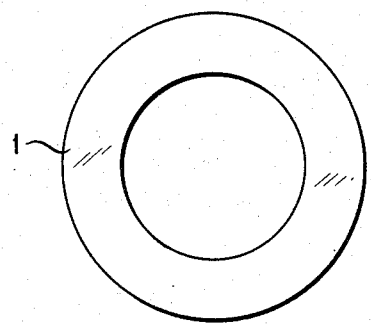
FIG. 1 is a plan view of an example of a binder sheet used in this invention for making a grinding stone.

Forming of conductive layers of a predetermined pattern:

Binder sheets used in this invention are such as the one illustrated in FIG. 1 which is for composing a common flat grinding stone. The binder sheet 1 is an annulus having an outer diameter of about 150–450 mm, a difference of the outer and inner diameters of about 5–10 mm, and a thickness of 0.03–0.3 mm, preferably of about 0.1–0.3 mm. While the following description is made utilizing the specific sheet illustrated in FIG. 1 for the sake of simplicity in explaining the invention, it is a matter of course that the shape of binder sheets shall not be limited thereto. The binder sheet 1 can be made from any materials which can be bonded to each other to an integrate by warm or hot pressure-molding. However, as they are to compose a grinding stone, they shall be generally resinous or metallic sheets.

As resinous sheets, those made from various resins such as phenol, epoxy, and polyester resins are utilized, while a sheet, core of which is made by non-woven fabrics and impregnated with or coated by resins is also employable though this sheet has a little drawback due to surface roughness. For instance, a commercially available structural thermal bonding film, Model No. D3032 manufactured by Sony Chemicals Corp. has a surface roughness of as much as about 40 μm, since it is made by a core of non-woven fabrics impregnated with phenol resins. On account of this surface roughness, pattern lines having a width of 0.3 mm or more are only drawable on said sheet without break of lines and without adversely affecting the quality of patterns. In addition to this disadvantage, fabrics remaining at and around the outer surfaces after pressure-molding form a little nap which hurts the appearance of grinding stones. As described in more detail hereinafter, the more a pattern of electrically conductive layers on a binder sheet is minute and the more the pattern lines are narrow, the more easy the control of distribution of abrasive grains becomes. And, since how minute and narrow the pattern and pattern lines are is largely dependent upon the surface roughness of resinous sheets, the surfaces of sheets have to be smooth as much as possible.

It shall be noted also that resinous sheets act as binding agents when they are subjected to warm or hot pressure-molding as described hereinafter. In the pressure-molding operation, a binder sheet made from resins only is apt to flow out from a mold, whereby fine molding becomes difficult. It is, therefore, preferable to prevent the flow of resins from a mold by means of mixing various kinds of additives into the resins. Such additives are those which can improve the characteristics of the binder sheet as a binding agent such as anti-abrasiveness and hardness thereof. They can be selected from inorganic compounds including silicon carbide, boron carbide, alumina, selenium oxide and so on, and metallic powders including copper powders, iron powders and so on. Especially, silicon carbide is suitable for the purpose, as it has a high hardness. Particle sizes of such additives shall preferably be small, since when the particles are too coarse, they settle in a resinous solution too fast, whereby it becomes difficult to produce resinous binder sheets of a constant quality. For example, silicon carbide having a particle size lower than #1500, more preferably lower than #2000 can produce SiC added resinous binder sheets of a stable quality.

The desirable range for the mixing ratio of an additive to resins could be determined case by case, in consideration of the aforementioned characteristics of resinous sheets as binding agents, their moldability and so on, as said ratio depends on the kinds of resins, the kinds and particle sizes of the additive, and others, and it is subsequently not constant. For example, in the case of adding SiC powders to a phenol resin, the mixing ratio is preferably about 1:1–1:3 by weight.

Resinous binder sheets which are employable in this invention can be made by various sheet molding methods, while resinous sheets on the market can be employed too. However, it is desirable to utilize a molding method which can produce smooth-faced sheets, since surface smoothness of the sheets has a great influence on a pattern of conductive layers to be made on the surface, as mentioned above. One of the most preferable methods is as follows.

Resins or resins added by the above-mentioned additives are further mixed with a small amount of solvent such as toluene, methyl ethyl ketone, and so on. This mixture is applied on a parting paper, that is, a paper such as a kraft, grassine, and resin-coated paper treated with silicon. A blade or roller is applied over the mixture at a predetermined distance from the parting paper, so that the mixture is given a desired thickness and consequently smoothed. The parting paper with the resin mixture thereon is put into a drier furnace. The temperature for drying is usually 100°–150° C., and the time therefor around 5 minutes, though they vary a little with a thickness of the resin mixture. When the sheet comes to have a thickness of 0.08–0.1 mm for example by the above treatment, the residual rate of the solvent in the sheet after it is dried is about 1–5%. Thereafter, the resin mixture film is removed from the parting paper to obtain a resin sheet. The sheet is punched out to produce a binder sheet having a configuration such as shown in FIG. 1.

Figure 2:
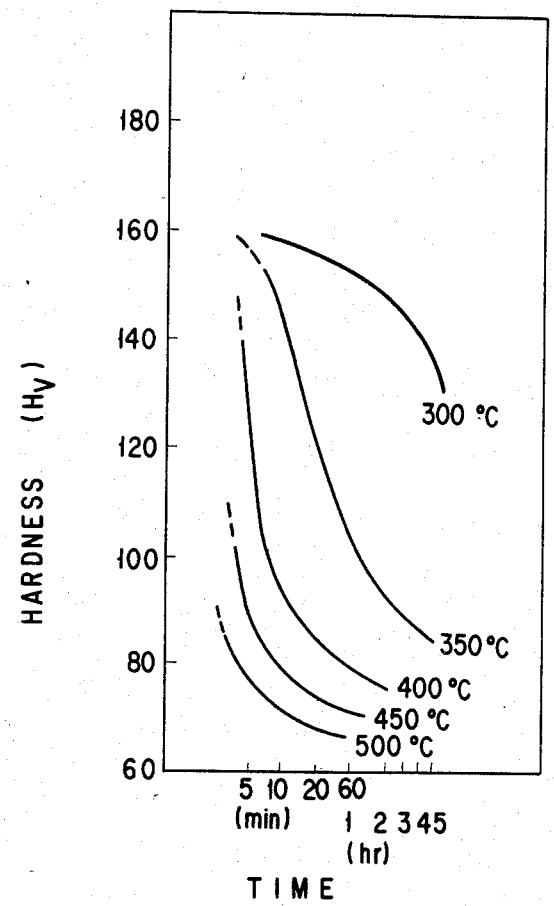
FIG. 2 is a graph showing annealing conditions and hardness of 70/30 brass which is advantageously employable for making the binder sheet.

The use of a metallic sheet as a binder sheet is advantageous in that by making its exposed surfaces directly as electrically conductive layers, the sheet can act as one of the electrodes in the electroplating, in addition to performing its primary role as a binder substratum for abrasive grains. In this regard, electrically conductive metals are advantageously utilizable, which include copper, alloys thereof, aluminum alloys, and the like, and among which a brass sheet containing 70–90 weight % of copper is most advantageously utilized. The following explanation of an example of this invention is therefore made with reference to the brass sheet. As explained hereinafter more in detail, metallic sheets are produced by a hot rolling process, work hardening which increases sometimes the hardness of the sheets too much. Hence, when they are to be less hard, they have to be annealed. The relation between annealing conditions (time and temperature) and hardness of 70/30 brass is given in FIG. 2. On the other hand, when harder sheets are required on purpose, they shall be obtained by adding to brass a certain amount of iron.

While the thickness of metallic sheets varies in accordance with particle sizes of the abrasive grains used, it shall generally be 30–100 $\mu$m if the sizes are within a range of #60–#270 which is safely adoptable in this invention. When the thickness is too small, processing and handling of the sheets become hard, while the control of distribution of grains becomes inadequate when the thickness is large. Though such proper thickness of the sheets is obtainable by conventional hot rolling, they have to be annealed sometimes after being hot rolled.

After the production of a binder sheet, it shall be provided on its selected surface with a pattern which consists of electrically conductive layers and which is intended to be sites where abrasive grains are fixed. Now, the principal part of this step "Forming of conductive layers of a predetermined pattern" is explained hereinafter.

In the case an electrically nonconductive binder sheet such as a resinous one is employed, this step comprises coating directly on the sheet conductive layers of a desired pattern.

On the other hand, in the case an electrically conductive binder sheet such as the above-mentioned kind of metallic sheets is employed, the step comprises forming electrically nonconductive layers by a desired pattern of masking so as to control sites to be bonded with abrasive grains and consequently to control the distribution of grains over the sheet. In other words, in this instance, a surface of the sheet is masked by a desired pattern of electrically nonconductive layers, leaving the sites to be bonded with grains uncovered, so that the exposed parts of the surface of the sheet constitute by themselves a pattern of electrically conductive layers.

While there are a number of methods for forming on a surface of a resinous binder sheet a pattern of electrically conductive layers, it shall be most preferable to form it by photoetching or printing techniques, when minute features of the pattern and fineness of pattern lines to be drawn, and the elaborate nature of the desired works must be taken into consideration.

When photoetching techniques are employed, the surface of a resinous binder sheet is coated by an electrically conductive material such as copper which is in turn applied with a photosensitive high molecular compound or a mixture of a high molecular compound and photosensitive materials. The sheet is subjected to exposure in accordance with a desired pattern, and removed of its unexposed portions by a solvent to obtain anti-corrosive filmy pattern lines. Then, the electrically conductive coating material is chemically or electrochemically etched so as to remove the coating material other than those composing the pattern lines, whereby the desired pattern of electric conductive layers is made on the sheet.

When printing techniques are employed on the other hand, resinous binder sheets are printed directly by using electrically conductive paints such as a silver paste.

Figure 3:
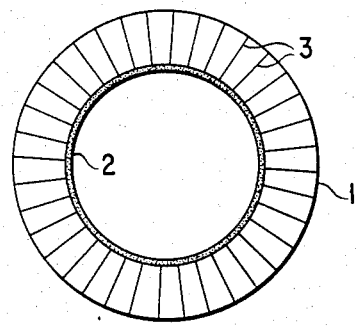
FIG. 3 to FIG. 5 are plan views illustrating electrically conductive layers of different patterns formed on the surfaces of resinous binder sheets.
Figure 4:
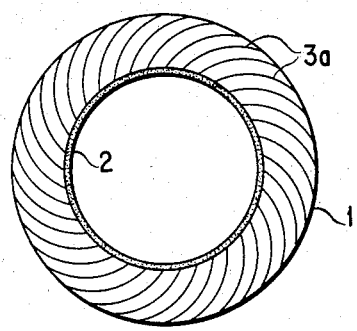
Figure 5:
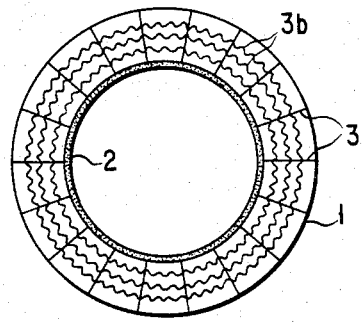

An example of a pattern of electrically conductive layers formed on a surface of a binder sheet is illustrated in FIG. 3, in which to an inner circular portion of the annular binder sheet 1 there is provided a main circuit 2 which acts as an electrode in the electroplating operation. A number of narrow circuits 3 extend radially outwardly from the circular main circuit, which narrow circuits are to be bonded with abrasive grains by electroplating. It shall be noted that the main circuit 2 as well as the narrow circuits 3 are those made by electrically conductive layers in accordance with one of the aforementioned methods. In FIGS. 4 and 5, there are shown other examples of patterns of conductive layers. In FIG. 4 the narrow circuits 3b volute from the main circuit 2, while in FIG. 5 a number of narrow circuits 3b draw ripples about the main circuit 2 and electrically connected to the main circuit by the narrow circuits 3 which extend from the main circuit radially outwardly. It is a matter of course that the pattern of conductive layers can take various shapes other than those illustrated in the drawings.

Photoetching and printing techniques were scrutinized with respect to their adoptability as a method for preparing patterns of electrically conductive layers in this invention. An example of results is given in the following Table-1.

TABLE-1

(Comparison of photoetching and printing techniques as a method for forming patterns)

| | Photoetching method | Printing method |
| --- | --- | --- |
| resin sheets employed | sheets made from solid resins, having high surface smoothness | Sony Chemical's D-3022 |
| minimum line width | 0.1 mm | 0.3 mm |
| frequency of line breakages | 5-15% according to kinds of patterns | substantially nil |
| deterioration of resins of the sheets | resinous sheets were rolled when washed | none |

The above table shows that since the minimum width of pattern lines which can be drawn on a binder sheet is largely influenced by surface roughness the sheet has and since Sony Chemical's D-3022 which was used in the printing method has a coarse surface with as much as a roughness of 40 μm, pattern lines drawn on said sheet could not be very fine. When solid resinous sheets which do not employ non-woven fabrics as core thereof, but are made by means of coating resins directly on a parting paper, were used in the printing method, they could bear fine lines as in the photoetching method. Hence, the printing method is generally preferable for drawing pattern lines in this invention.

In the printing method, paints of a paste form which contain electrically conductive materials such as silver powders mixed into a medium, are employed as aforementioned. Such medium shall preferably be a resinous solution containing phenol, epoxy, and other resins. Possibly on account of good wettability to resinous binder sheets, paints contained with epoxy resins as their mediums can produce especially a clear print, viz., fine pattern lines.

While in the formation of a nonconductive masking pattern on a surface of a metallic binder sheet, various methods are employable, a printing method by applying resins and a method employing a photoresist such as ultraviolet ray hardening resins are most preferable when the narrowness of unmasked lines and easiness of works are taken into account.

The resin-applied printing method in which nonconductive resins are printed on a surface of a metallic sheet by conventional method, is inexpensive and easy to operate. However, it shall be noted that in this printing method, though abrasive grains of a comparatively coarse grain size, viz., #60-#120 are safely employable, the employment of those of a finer grain size is not recommendable, since a print producible by this printing method has a thickness of 0.1-0.2 mm. Although it is feasible for reducing the thickness of the print to lower the viscosity of resins employed, this does not always give good results, since the print becomes often loose and a pattern is apt to be unclear.

On the other hand, in the method employing a photoresist such as ultraviolet ray hardening resins in which the resins are exposed to an ultraviolet ray through a negative having images correspondent to an nonconductive masking pattern, so as to be hardened and fixed thereby onto a binder sheet, a resinous film of a desired thickness can be formed by applying on the sheet those resins which are hardenable by an ultraviolet ray, while filmy resins commercially available on the market such as Asahi Chemical's Dry Film Resist can advantageously be utilized since it can readily afford resinous films of a fine and even thickness and can produce thereon clear patterns. Said Dry Film Resist consists of a layer structure composed of a carrier film, photoresist, and cover film, and is sold in the varieties enumerated in the following Table-2.

TABLE-2

(Varieties of Dry Film Resist manufactured by Asahi Chemicals Co., Ltd.)

| Grade | Thickness of resist | Main purposes |
| --- | --- | --- |
| E-15 | 15 μm | for etching |
| P-25 | 25 μm | for plating |
| P-38 (T-38) | 38 μm | for plating, tinting |
| T-50 | 50 μm | for tinting |

Figure 6:
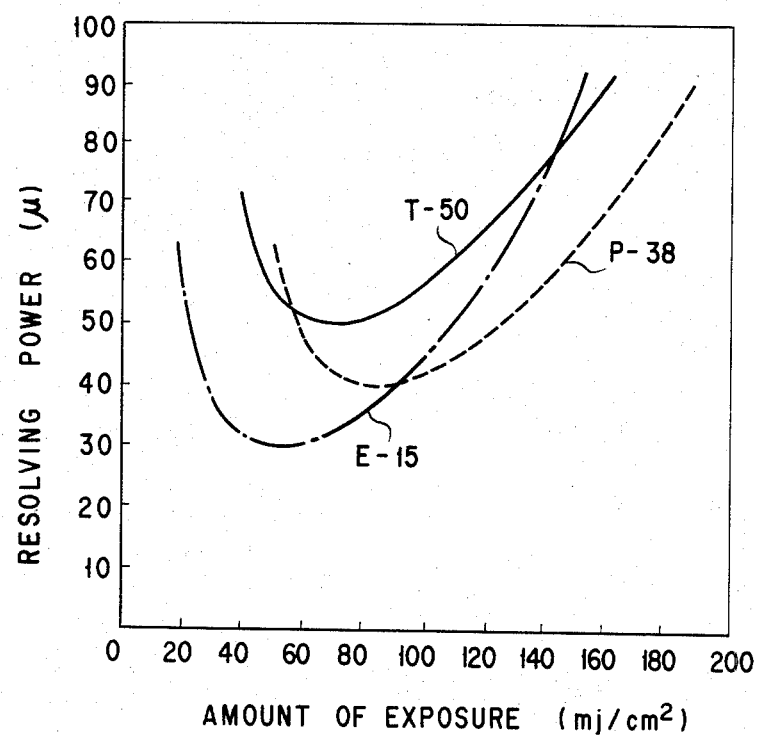
FIG. 6 is a graph showing the relation between resolving powers by an ultraviolet ray of patterns of dry film photo (ultraviolet ray) resists and exposure amounts of the ultraviolet ray.

As illustrated in FIG. 6 in which relations between resolving powers of patterns on said resists and amounts of exposure are given, such resolving powers of the level of 100 parts which are not obtainable by printing methods, are attained here. After the exposure, the unexposed resist and carrier film are removed by dissolving them by a solvent such as 1,1,1-trichloroethane.

Figure 7:
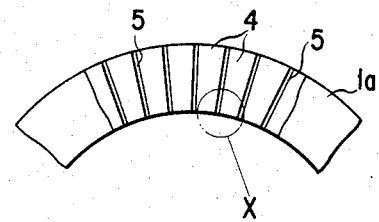
FIG. 7 is a plan view of a part of the masking pattern of electrically nonconductive layers formed on a metallic binder sheet.
Figure 8:
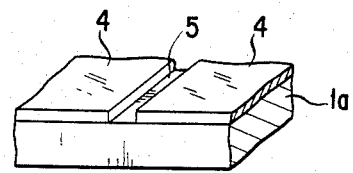
FIG. 8 is an enlarged perspective view of a part of the sheet indicated by X in FIG. 7.

An example of electrically nonconductive layers of a desired masking pattern thus formed on a surface of a metallic binder sheet is illustrated in FIGS. 7 and 8, in which the nonconductive layers are represented by numeral 4, while unmasked portions of the metallic sheet 1a which are exposed among the nonconductive layers 4 in accordance with the masking pattern, are represented by numeral 5. In the instance of the unmasked portions 5 illustrated in FIGS. 7 and 8 and extending radially outwardly, distances between respective adjacent unmasked portions are made to be about 10 mm, while the appropriate distance can be selected in accordance with sizes of abrasive grains and the desired distribution of the grains. The unmasked portions 5 of the sheet 1a are to be electroplated with the grains. It is a matter of course that the masking pattern can take any shape such as illustrated in FIGS. 4 and 5 besides the one illustrated in FIGS. 7 and 8, provided however that in case of this metallic binder sheet, it is not necessary to provide the main circuit 2 the case of the resinous sheets illustrated in FIGS. 3 to 5, since the metallic sheet has conductivity by itself and can be connected directly to a cathode without an intervenient such as the main circuit 2.

Figure 9:
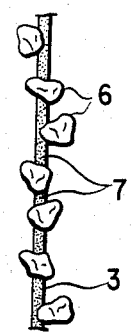
FIG. 9 is an explanatory perspective view illustrating how abrasive grains are fixedly mounted on a narrow pattern of conductive layers on a sheet.

Electroplating of abrasive grains:

Next, binder sheets thus formed with narrow circuits of conductive layers or with unmasked metallic portions exposed among the nonconductive layers, are to be electroplated by abrasive grains by any of the conventional electroplating methods. To wit, the main circuit 2 of the binder sheet 1 is connected to a cathode of a plating apparatus while the main circuit is masked by the printing, coating, and other applications of nonconductive materials thereover. The sheet is then immersed in an electrolytic bath containing metallic ions and abrasive grains dispersed therein, while being kept horizontally. Abrasive grains settle on the upper surface of the binder sheet, since they are heavier than an electrolyte in the bath, and present their precipitates spreaded all over the surface. Then, electric paths are made between an anode immersed in the bath and the conductive main circuit 2, and consequently the narrow circuits 3, whereby those grains 6 seating on the narrow circuits 3 are fixed by metallic layers 7 deposited on the narrow circuits so as to surround the grains, as shown in FIG. 9. When the sheet is removed from the bath, it has grains bonded only to the narrow circuits.

Figure 10:
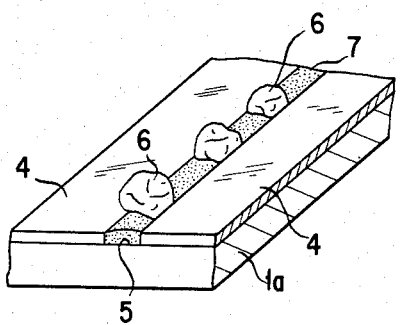
FIG. 10 is an explanatory view illustrating grains fixed to a metallic binder sheet.

If a metallic binder sheet 1a is used, a cathode is directly connected to the sheet, and immersed into the bath in the same manner as described above. When electric paths are established between an anode within the bath and the metallic sheet 1a, only those grains precipitated on the unmasked or exposed portions of the metallic sheet are fixed to the sheet, as shown in FIG. 10, by metallic plated layers 7 deposited on the unmasked portions. When the sheet is drawn up from the bath, it is observed that the sheet 1a is fixedly provided with grains 6 only on the unmasked portions 5. In order to precisely control the distribution of grains, it is preferable to form a nonconductive film all over a surface opposite to another surface of the sheet 1a where the nonconductive layers 4 are formed, so that the adhesion of grains to said opposite surface by electroplating can completely be prevented. Generally, however, this kind of formation of a nonconductive film all over the opposite surface can be neglected, since abrasive grains in the bath dispersed below the sheet or adhered to the bottom surface of the sheet settle down to the bottom of the bath by their own gravity.

As mentioned above, the width of narrow circuits shall be thinner as much as possible in order to obtain the precise control of distribution of abrasive grains. This preference prevails also in electroplating conditions. To wit, the conditions which are described more in detail hereinafter shall be good enough if they can fix the grains temporarily to their predetermined sites on the sheet. Excessive amount of electroplating adversely affects the results as in the case of the narrow circuits having a comparatively thick width. The width of the unmasked portions 5 of a metallic sheet shall not be too thick, too.

Electrolytic baths and electrolytes used in this invention are not limited, but they can be selected from electrolytic baths conventionally used for plating nickel, chrome, copper, alloys thereof, and so on, since the electroplating employed in the method of this invention aims primarily and only to fix adhesive grains to a binder sheet and such fixing of grains to the sheet is not largely influenced by technical qualities in the electroplating and metals deposited thereby. However, it is cautioned not to use such electrolytes which are harmful to a binder sheet but to use adequate electrolytes matched with the kinds and characteristics of resins or metals composing the binder sheet.

Electroplating conditions are properly settable in consideration of the above remarks and in accordance with an electrolyte employed. For example, in electroplating conditions employed in this invention for a typical nickel plating, current density was 0.1–1 A/dm$^2$, voltage 0.2–1.5 V, time for plating 10–60 minutes, and temperature of the electrolyte 30°–60° C.

On the other hand, the electroplating of the metallic binder sheet consists of a preliminary electroplating stage in which plating is made only to fill the unmasked spaces among the nonconductive layers, and a principal stage in which plating is made to positively mount abrasive grains to the sheet. The preliminary plating stage can be conducted under a mild condition in view of its object, in which current density shall be for example above 1 A/dm$^2$. Its plating time shall be about 10–20 minutes, though this varies in accordance with thickness of the nonconductive layers and gap or width distances of the unmasked spaces. The principal plating is made on the other hand under a weak condition in order to minimize an amount of plating, in which current density is in a range of 0.1–0.5 A/dm$^2$ and plating time is the same as in the preliminary plating stage, viz., about 10–20 minutes. After the completion of the two plating stages, the electrically nonconductive layers are removed by subjecting them to a chemical bath and the like.

Warm or hot pressure-molding of a plurality of binder sheets in layers into an integrate grinding stone:

A desired number such as 100–500 sheets of the binder sheets thus fixedly mounted with abrasive grains by electroplating, are piled in layers and subjected to the warm or hot pressure-sintering and molding. The molding of resinous binder sheets is made as follows, for example.

Figure 11:
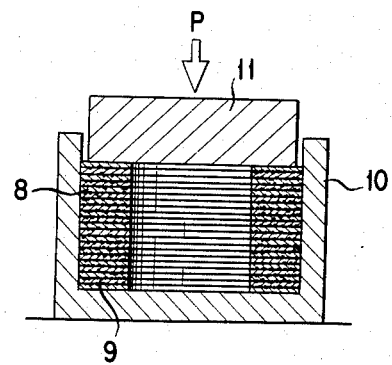
FIG. 11 is also an explanatory view illustrating the warm or hot pressure-molding of a plurality of binder sheets.

As illustrated in FIG. 11, within a mold 10 there are placed in layers and in accordance with a predetermined rule a plurality of grain-bonded resinous binder sheets 8 and resinous filler sheets 9. A press 11 is placed over the layers of the sheets. They are subjected thereby to a high pressure and temperature for a predetermined time. The pressure is normally about 400 Kgf/cm$^2$, temperature about 150°–200° C., and time about 30–120 minutes, though these can be varied in accordance with dimensions, viz., diameter and thickness of a grinding stone to be molded. During this molding operation, pressure is released several times for letting gas generated from the sheets out of the mold. The sheets thus integrated to a grinding stone are provided with abrasives distributed on the selected layers and in order.

The molding of metallic binder sheets is generally made by keeping them for about 30–120 minutes in a deoxidizing atmosphere held under a pressure of about 400–600 Kgf/cm$^2$ and a temperature of about 70% of the melting point of the binder sheets, that is about 650° C. in case of brass, though these conditions can be varied in accordance with the dimensions of a grinding stone to be made, viz., its diameter and thickness. The sheets are thus integrated by their thermal and pressure contacts to each other, producing a metallic grinding stone with abrasives projectedly lying among the metal. A core spindle such as the one made from aluminum is insertedly fitted to a central hole of the grinding stone.

When binder sheets bonded with grains are too thin to afford the grains with an adequate axial distance for the distribution thereof or when the sheets can not provide by themselves a sufficient amount of resinous or metallic materials as binding agents, they can be piled in layers with filler sheets or powders one after the other.

As briefly mentioned above, the binder sheets bonded with abrasive grains are piled in layers in accordance with a predetermined rule, together with or without filler sheets not bonded with any abrasives or filler powders. The object of said rule is to control the distribution of grains, as explained below, and it includes a mode of piling in which sheets in each layer are located with respect to each other with a displacement of an angular distance about their common longitudinal axis, so that the axial and circumferential distribution of grains can be controlled as desired.

Thus, grains of the grinding stone made in accordance with this invention are given, by means of a selected pattern of conductive layers or nonconductive masking, a desired one-dimensional distribution in a rotary direction of the grinding stone or two-dimensional distribution in said rotary and radial directions. In addition to these distributions, the distribution of grains along the direction of piling, viz. axial direction in case of a flat grinding stone can selectively be varied in accordance with a piling mode of sheets.

Figure 12:
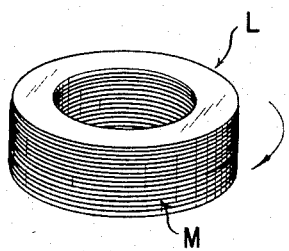
FIG. 12 is a perspective view of an integrated grinding stone made by a plurality of grain mounted binder sheets.
Figure 13:
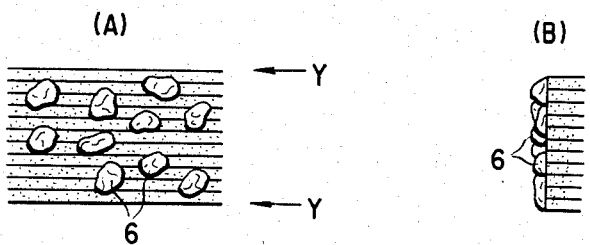
FIG. 13(A) is a plan view of an outer circumferential surface of the integrate of FIG. 12.
FIG. 13(B) is a view of FIG. 13(A) taken along arrows Y,Y in FIG. 13(A)

As shown in FIG. 12 in which an integrate of sheets in layers is generally indicated by L, those which constitue grinding faces in the integrate are outer circumferential surfaces M. And, in order to improve grinding or cutting efficiencies of said surfaces M, the grains 6 distributed on the surfaces as shown in FIG. 13(A) have to be overlapped with each other when viewed in the rotary direction of the grinding stone or in a direction indicated by Y,Y in FIG. 13(A) and as best shown in FIG. 13(B). Such overlapping distribution of abrasive grains is largely dependent upon their axial distribution which is in turn determined primarily by piling methods of binder sheets. Hence, in this method, a due consideration has to be paid to how the binder sheets are located and piled.

Control of grain distribution:

There are very few publications on the theory of distribution of grinding edges in a grinding stone, since it has been a common knowledge that random distribution of the grinding edges is inevitable and inherent to the grinding stone. However, there are a few theses discussing nothing but abrasive grains per se which contribute to grinding and their distribution, viz. a distribution of effective grinding edges over a surface of a grinding stone. Among them, a thesis written by Mr. Kazuo Nakayama and entitled "Relation between grinding and cutting" Vol. 23, No. 5 (1971), pages 174- of "Study of machineries" says that the ratio of abrasive grains actually contributing to the grinding with respect to the entire grains on the surface of a grinding stone is only about 2%, indicating that the remnant 98% of grains are ineffective to the grinding operation. In his thesis, it is noted specifically that the distance between abrasive grains, viz. effective grinding edges on a surface of grinding stone at a single axial turn thereof is as large as about 100 mm.

As explained above, this invention is to effectively control the above-mentioned kind of poor distribution of grains, whereby ineffective grains are eliminated as much as possible and grinding efficiencies are improved. The control of distribution of grains in this invention can be made as aforementioned, namely one-, two-, and three-dimensionally.

First, as said one-dimensional control in accordance with this invention, the distribution of grains in a rotary direction of a grinding stone or over its circumferential direction can be controlled by the aforementioned formation of a selected pattern of conductive layers or masking pattern of nonconductive layers. For instance, a pattern such as illustrated in FIG. 3 can assure that the grains are deposited on the narrow circuits 3 with constant distances therebetween and along the rotary direction of a grinding stone, whereby the one-dimensional control of distribution of grains can be made by properly selecting space distances between the narrow circuits, even if binder sheets thus deposited with the grains are piled at random.

A pattern illustrated in FIG. 4 includes a two-dimensional element since there is involved a radial distribution in addition to the distribution of grains in a rotary direction thereof.

Figure 14:
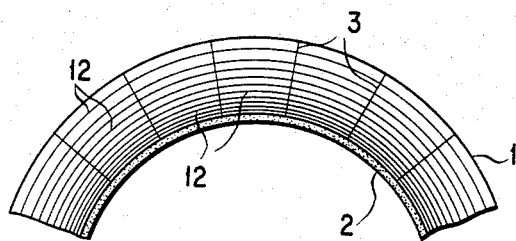
FIG. 14 is a partial plan view of an example of a pattern consisting of electrically conductive and nonconductive layers.

Besides the distributions of grains in the rotary and radial directions, the thickness of a binder sheet works as an element for composing a two-dimensional distribution of grains. To wit, abrasive grains come to distribute on a circumferential surface of a grinding stone with such specific axial distances therebetween which are dependent on the thickness of the binder sheet or a total thickness of a grain-bonded binder sheet and filler sheet when the latter is used. And, as illustrated in FIG. 14 in which upon the radially extending narrow conductive circuits 3 there are overlaid a ripply masking 12 consisting of a plurality of circular nonconductive layers which are concentric with the main circuit 2, the linear conductive circuits 3 become dotted whereby the radial distribution of grains can be controlled by dotted lines rather than solid lines. Thus, such distribution of grains is controlled at the stage of patterns formation. For example, the masking of the above-mentioned kind can be readily obtained by lapping two prints. To wit, at the first printing, electrically conductive narrow circuits 3 are printed, while at the second printing there are printed the nonconductive masking 12. This nonconductive masking can be applied similarly on the pattern illustrated in FIG. 4. In case of the pattern illustrated in FIG. 5 too, the ripply narrow circuits 3b can be replaced by similar nonconductive maskings.

While a selected combination of the elements, viz., the distribution of grains in a radial direction, distribution of grains in a rotary direction, and thickness of a binder sheet can control the overall distribution of grains of a grinding stone two-dimensionally, even three-dimensional control could be achieved by them.

Besides the thickness of a binder sheet as mentioned above, the angular distance by which the binder sheets mounted with grains are turned to each other about their common axis when they are piled in layers, is given as an element determinative of the three-dimensional distribution of grains. That is, the distribution of grains in the direction of piling the sheets or in the axial direction of a grinding stone can be controlled if the sheets are piled in layers after having them turned to each other with slightly different angular distances. In this invention, therefore, it is possible to control the distribution of grains three-dimensionally by changing the distribution of grains in the axial direction of a grinding stone along with the variation of the aforementioned elements, viz., the distribution of grains on a binder sheet in its radial direction, and distribution of grains in the rotary direction of a grinding stone.

Figure 15:
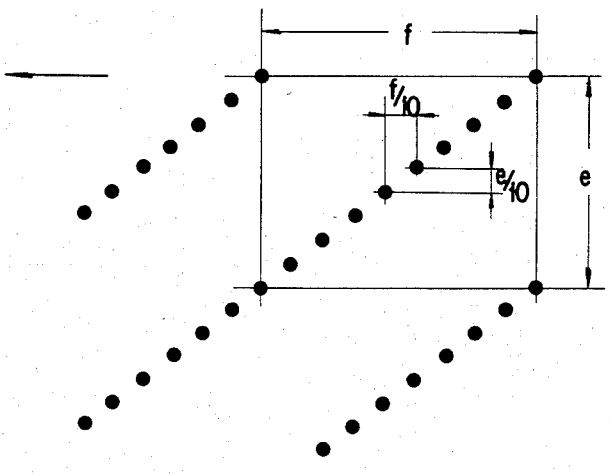
FIG. 15 is a model chart illustrating an example of distribution of abrasive grains on grinding surfaces of a grinding stone made in accordance with this invention.

As mentioned above, an example of distributions of grains in the rotary direction of a grinding stone and in the axial direction thereof on its outer circumferential surfaces are illustrated by a chart in FIG. 15, in which an arrow shows the rotary direction of a grinding stone. It has been found by the inventor of this invention that the distance between grains in the rotary direction of a grinding stone which is indicated by f in FIG. 15 shall be less than 25 mm, and that in the axial direction thereof, viz. e in the drawing, less than 1 mm for obtaining a good grinding efficiency. The distance f can be controlled by the grain distribution in the rotary direction of a grinding stone, and the distance e by the grain distribution in the piling direction of sheets, viz., an angular distance by which each binder sheet mounted with abrasive grains is axially turned when it is piled.

In the method of this invention, common abrasive grains such as those made from alumina, silicon carbide and so on can be employed besides super abrasive grains made from diamond, cubic boron nitride, and the like. Though this invention does not deal with the improvement of the randomness of cutting edges and shapes a grain has by itself, it could be said that when compared to common abrasive grains, super abrasive grains have less randomness since most of them are have constant shapes such as octahedra arranged by atomic structures in order. And, when super abrasive grains are used, the variation of their surface edges with time can be neglected, since they are extremely hard and can hardly be worn. Therefore, it is preferable to use super abrasive grains, whereby the effects of this invention can be enhanced more.

As described above, the method of this invention can selectively control the distribution of abrasives in a grinding stone contrary to the common knowledge that it inevitably has a random distribution of grains, by means of forming on a surface of a binder sheet a pattern of conductive layers with control sites on said surface to be bonded with the grains, fixing the grains to the surface in accordance with said pattern and by electroplating thereof, and warm or hot pressure-molding a desired number of the binder sheets fixed with the grains and placed in layers in accordance with a predetermined rule. It can therefore provide grinding stones having a desired two- or three-dimensional distribution of abrasives on their grinding surfaces. Uniformity of loads exerted on each grains, which is producible with such controlled distribution of grains in accordance with the method of this invention, can prolong the life of a grinding stone. The elimination or reduction of ineffective grains in accordance with this invention can considerably lower the price of grinding stones especially when expensive super abrasive grains are employed. In addition to these effects and advantages, a quantitative analysis and revision of grinding capacities of a grinding stone is made possible first time by this invention.

In the following, are given examples which describe the method of this invention in a concrete way, it being understood that the invention shall not limited thereby.

EXAMPLE 1

A mixture of phenol resins and SiC powders of a size #1500 at a weight ratio of 1:1 was added with a small amount of solvent either of toluene or methylketone and mixed well. The mixture was applied on a sheet of parting paper, and flattened by a blade kept over the sheet with a predetermined distance therefrom so as to give a specific thickness to the mixture and to smooth it also. And, then the sheet was dried at a temperature of 150° C. for about 5 minutes. The resinous sheet thus obtained having a thickness of about 0.1 mm was cut to a number of annular binder sheets as illustrated in FIG. 1 and having an inner diameter of 150 mm and a difference between the inner and outer diameters of 5 mm.

Upon a surface of the resinous binder sheet thus obtained, there was printed a pattern such as illustrated in FIG. 3 by a paint of a silver paste, in a medium of epoxy resins, while its main circuit except its terminal end was coated by a nonconductive paint by a lap printing method. After connecting the main circuit at its terminal end to a cathode of an electroplating apparatus, the sheet was immersed horizontally in a nickel electrolytic bath which contained dispersed diamond grains of a size #80, and subjected to the electroplating for about 20 minute with a current density of 1 A/dm².

A number of resinous binder sheets thus fixedly mounted with diamond grains and resinous filler sheets without the grains were placed in layers one after the other within a mold, and subjected to a pressure of 400 Kgf/cm² and a temperature of 150°-200° C. for about one hour. During this pressure-molding, the pressure was released several times for letting gases out. An integrate of the sheets in layers thus made was bonded to an aluminum core by a conventional method and finished, whereby a grinding stone was obtained. A surface grinding operation with said grinding stone was made at a grinding velocity of 1600 m/min, work velocity of 10 m/min, and with a kerf of 10, 10 μm, showing a good grinding efficiency.

EXAMPLE 2

A rolled sheet of brass containing 70 weight% of copper having a thickness of about 0.1 mm was cut to a number of annular binder sheets as illustrated in FIG. 1 and having an inner diameter of 150 mm and a difference of the inner and outer diameters of 5 mm. A surface of the metallic sheet was coated by phenol resins which were formed to a pattern such as illustrated in FIG. 7.

To the metallic binder sheet on which the masking pattern of electrically nonconductive layers had been formed, there was connected a cathode of an electroplating apparatus. The sheet was immersed horizontally into a nickel electrolyte dispersed with diamond grains of a size #80, and then subjected to electroplating for about 15 minutes with a current density of 1 A/dm² and succeedingly for about another 10 minutes with current density of 0.5 A/dm². Thereafter, the electric nonconductive layers were washed off by butyl ether.

A number of metallic binder sheets thus mounted with the grains and metallic filler sheets without grains were piled in layers one after the other within a mold, and then subjected to pressure sintering molding under a pressure of 400 Kgf/cm² and at a temperature of about 650° C. During the pressure-molding which was held for about one hour, pressure was released several times in order to let gases out. The layers made to an integrate were bonded to an aluminum core, and finished to obtain a grinding stone. A surface grinding operation employing said grinding stone was conducted with a grinding velocity of 1600 m/min, work velocity of 10 m/min, and a kerf of 10, 30 μm, presenting an excellent grinding capacity.

I claim:

1. A method of making a grinding stone, which comprises:
    forming on a surface of a binder sheet of a desired configuration a pattern of electrically conductive layers for selectively controlling sites on said surface to be bonded with abrasive grains;
    immersing the sheet in an electrolytic bath containing metallic ions and having abrasive grains dispersed therein;
    fixedly mounting on the pattern of electrically conductive layers the abrasive grains by means of metals deposited by electric paths flowing between said conductive layers and an opposite electrode in the bath;
    piling in layers a plurality of the binder sheets mounted with the abrasive grains; and
    warm or hot pressure-molding the layers into an integrate of the grinding stone.

2. The method as claimed in claim 1, in which the plurality of the binder sheets mounted with the abrasive grains are piled in layers in accordance with a predetermined rule.

3. The method as claimed in claim 1, in which the binder sheet is an annulus having an outer diameter of about 150–410 mm, and a difference of the outer and inner diameters of about 5–10 mm.

4. The method as claimed in claim 1, in which the binder sheet is resinous.

5. The method as claimed in claim 1, the binder sheet is made from phenol, epoxy, or polyester resins.

6. The method as claimed in claim 5, in which the resins are mixed with additives selected from inorganic compounds including silicon carbide, boron carbide, alumina, and selenium oxide or with metallic powders.

7. The method as claimed in claim 1, in which the binder sheet is made of non-woven fabrics impregnated with or coated by resins.

8. The method as claimed in claim 1, in which the pattern of electrically conductive layers is formed on the surface of the binder sheet by printing thereon electrically conductive paints.

9. The method as claimed in claim 8, in which the electrically conductive pairs are of a paste form made from a medium mixed with electrically conductive materials such as silver powders and the like.

10. The method as claimed in claim 9, in which the medium is a solution of phenol, epoxy, and the like resins.

11. The method as claimed in claim 1, in which the pattern of electrically conductive layers on the surface of the binder sheet is made by applying coatings on said surface, and applying on said coatings a photosensitive high molecular compound or a mixture of a high molecular compound and photosensitive materials, exposing the compound or mixture to a desired pattern, removing unexposed portions of the compound or mixture from the surface of the binder sheet by washing them by a solvent to produce anti-corrosive filmy pattern lines, removing the conductive layers other than said filmy pattern lines by etching the layers chemically or electrochemically, and then removing the remnant compound or mixture from the surface by washing them.

12. The method as claimed in claim 1, in which the pattern of electrically conductive layers consists of a main circuit formed along an inner periphery of the annular binder sheet and a plurality of narrow circuits extending radially outwardly from said main circuit.

13. The method as claimed in claim 1, in which the pattern of electrically conductive layers consists of a main circuit formed along an inner periphery of the annular binder sheet and a plurality of narrow circuits voluting outwardly from the main circuit.

14. The method as claimed in claim 12 or 13, in which the annular binder sheet is additionally provided at its surface with narrow circuits drawing circles which are concentric with the sheet main circuit.

15. The method as claimed in claim 14, in which the narrow circuits which make concentric circles are ripply.

16. The method as claimed in claim 12, in which the binder sheet is immersed in the electrolytic bath containing metallic ions after connecting the main circuit on the surface of the binder sheet to a cathode of an electroplating apparatus and after masking said main circuit.

17. The method as claimed in claim 1 or 16, in which the binder sheet with the pattern of electrically conductive layers formed on its surface is immersed in the electrolytic bath containing metallic ions while it is kept horizontally.

18. The method as claimed in claim 1, in which metallic ions contained in the electrolytic bath are from nickel, chrome, or alloys thereof.

19. The method as claimed in claim 1, in which the abrasive grains are those made from diamond, cubic boron nitride, alumina, or silicon carbide.

20. The method as claimed in claim 1, in which the plurality of binder sheets mounted with the abrasive grains are piled in layers for the molding thereof with binder filler sheets or filler powders of the same material with the binder sheets one after the other.

21. The method as claimed in claim 2, in which the plurality of binder sheets mounted with the abrasive grains are piled in layers so as to be disposed with respect to each other with an axially turned displacement of a predetermined angular distance therebetween.

22. The method as claimed in claim 1, in which the plurality of binder sheets piled in layers are hot pressure-molded under a pressure of about 400 Kgf/cm² and a temperature of 150°–200° C. for 30–120 minutes.

23. A method of making a metalic grinding stone, which comprises:
    forming on a surface of a metallic binder sheet of a desired configuration a desired masking pattern of electrically nonconductive layers for selectively controlling sites on said surface to be bonded with abrasive grains by means of said masking pattern which selectively exposes the metallic surface of the sheet;
    immersing the sheet in an electrolytic bath containing metallic ions and having abrasive grains dispersed therein;

fixedly mounting on the exposed surface of the sheet the abrasive grains by means of metals deposited by electric paths flowing between the metallic binder sheet and an opposite electrode in the bath;

piling in layers a plurality of the sheets mounted with the abrasive grains after removing the electrically nonconductive layers from the sheet; and warm or hot pressure-molding the layers into an integrate of the metallic grinding stone.

24. The method as claimed in claim 23, in which the plurality of metallic binder sheets mounted with the abrasive grains are piled in layers in accordance with a predetermined rule.

25. The method as claimed in claim 23, in which the metallic binder sheet is an annulus having an outer diameter of about 150–450 mmm, a difference between the outer and inner diameters of about 5–10 mm, and a thickness of about 0.03–0.3 mm.

26. The method as claimed in claim 23, in which the metallic binder sheet is made from copper, alloys thereof, or aluminum aloys.

27. The method as claimed in claim 23, in which the metallic binder sheet is made from brass containing 70–90 weight % of copper.

28. The method as claimed in claim 23, in which the desired masking pattern of electrically nonconductive layers is formed by printing the selected surface of the sheet with a nonconductive resinous solution.

29. The method as claimed in claim 23, in which the desired masking pattern of electrically nonconductive layers is made by coating the surface of the sheet by resins which are hardenable by an ultraviolet ray, hardening the resins by irradiation of an ultraviolet ray through a negative made in accordance with the masking pattern, and removing unexposed parts of the resins from the sheet.

30. The method as claimed in claim 29, in which the resins have layer structures consisting of a carrier film, photoresist, and cover film.

31. The method as claimed in claim 23, in which parts of the metallic binder sheet exposed from the masking pattern of nonconductive layers form a plurality of narrow circuits extending radially outwardly on the sheet.

32. The method as claimed in claim 23, in which parts of the metallic annular binder sheet exposed from the masking pattern form a plurality of narrow circuits which volute from the inner side of the sheet toward the outside thereof.

33. The method as claimed in claim 23, in which the exposed parts of the metallic binder sheet present a radial or volute pattern combined with circles which are concentric with the annulas of the sheet.

34. The method as claimed in claim 33, in which the circles are ripply.

35. The method as claimed in claim 23, in which the metallic binder sheet is immersed in the electrolytic bath containing metallic ions while it is kept horizontally.

36. The method as claimed in claim 23, in which metallic ions contained in the electrolytic bath are from nickel, chrome, or alloys thereof.

37. The method as claimed in claim 23, in which the fixedly mounting of abrasive grains on the metallic binder sheet is made by a preliminary electroplating conducted for about 10–20 minutes with a current density of about 1 A/dm$^2$ and a succeeding principal electroplating for about 10–20 minutes with a current density of about 0.1–0.5 A/dm$^2$.

38. The method as claimed in claim 23, in which the abrasive grains are made from diamond, cubic boron nitride, alumina, or silicon carbide.

39. The method as claimed in claim 23, in which the plurality of metallic sheets mounted with the abrasive grains are piled in layers for the molding thereof with metallic binder filler sheets or metallic filler powders one after the other.

40. The method as claimed in claim 24, in which the plurality of metallic sheets mounted with the abrasive grains are piled in layers so as to be disposed to each other with an axially turned displacement of a predetermined angular distance therebetween.

41. The method as claimed in claim 23, in which the plurality of metallic binder sheets with abrasive grains thereon which have been piled in layers are hot pressure-molded for about 30–120 minutes in a deoxidizing atmosphere held under a pressure of about 400–600 Kgf/cm$^2$ and at a temperature of about 70% of the melting point of the material constituting the metallic binder sheet.

* * * * *